United States Patent [19]

Smith et al.

[11] Patent Number: 5,537,055
[45] Date of Patent: Jul. 16, 1996

[54] METHOD FOR PROTECTING AN ASIC BY RESETTING IT AFTER A PREDETERMINED TIME PERIOD

[75] Inventors: Graham B. Smith, Burnaby; Charles K. Huscroft, Coquitlam; Vernon R. Little, Belcarra, all of Canada

[73] Assignee: PMC-Sierra, Inc., Canada

[21] Appl. No.: 269,083

[22] Filed: Jun. 30, 1994

[51] Int. Cl.[6] .................................................. H04L 9/00
[52] U.S. Cl. .................... 326/8; 326/16; 326/93; 380/4; 327/142
[58] Field of Search ................ 380/4, 23; 326/8, 326/93, 16; 327/142, 143

[56] References Cited

U.S. PATENT DOCUMENTS

| | | | |
|---|---|---|---|
| 4,609,777 | 9/1986 | Cargile | 380/4 |
| 4,970,418 | 11/1990 | Masterson | 326/93 |
| 5,343,085 | 8/1994 | Fujimoro et al. | 327/143 |
| 5,359,233 | 10/1994 | Mumper et al. | 327/143 |

Primary Examiner—David R. Hudspeth
Assistant Examiner—Benjamin D. Driscoll
Attorney, Agent, or Firm—Pascal & Associates

[57] ABSTRACT

A design protection circuit for a logic circuit comprised of a counter for receiving clock pulses with the logic circuit and apparatus for resetting the logic circuit upon the counter counting a predetermined number of clock pulses, the predetermined number being higher than a highest number of clock pulses required by the logic circuit for carrying out a simulated logical function.

6 Claims, 4 Drawing Sheets

5,537,055

METHOD FOR PROTECTING AN ASIC BY RESETTING IT AFTER A PREDETERMINED TIME PERIOD

FIELD OF THE INVENTION

This invention relates to application specific integrated circuits (ASICs) and particularly to a circuit and method for protecting the secrecy of their designs.

BACKGROUND TO THE INVENTION

ASICS are arrays of similar components that are manufactured in an integrated circuit for later conversion into a specific logical design. ASICs thus provide a relatively inexpensive way to create various complex designs using the same well-settled design components repeatedly.

The various components are interconnected by providing a netlist to the customer of the ASIC. The netlist is a list of which pads, terminals or nodes of components of the ASIC are to be connected to others to realize the complex logic circuit. The customer can either use the netlist to interconnect the components, or the ASIC supplier can interconnect the components by using the netlist, providing the completed logic circuit to the customer. The interconnection can be done by any of several well-known techniques, such as by metallization to provide conductive paths between the pads, terminals or nodes, or by blowing fuses to remove conductive paths between undesired pads, terminals or nodes.

The customer typically will have specified the logical operation to be conducted by the final circuit, but is not given the schematic diagram of the circuit that implements the logical operation. The object of providing the netlist but not the schematic diagram is to protect the supplier from persons learning of the circuit and copying and/or modifying the circuit in a manner unintended by the supplier, depriving the supplier of sales of value added modifications, for example. For example, a design may provide all possible features of a system, yet the netlist may specify connection of components to satisfy a low price purchase of only some of the features. By knowing the true design, a third party could manufacture the ASIC, changing the netlist a relatively small extent to provide all of the features, thus trading on the original supplier's development costs.

It is possible with today's computer aided design software programs and with some skill to recreate the schematic of the logic circuit, and provision of the netlist makes the supplier vulnerable to others, as noted above.

SUMMARY OF THE INVENTION

The present invention protects the design of the logic circuit embodied in the ASIC, even if the netlist is freely available to potential copiers of the logic circuit design. Copying of the design using the netlist, for example into a larger system results in copying of protection circuitry for the design. If the logic circuit is implemented in a manner unintended by the original design, the circuit is rendered unusable.

In accordance with an embodiment of the invention, a method of protecting the design of a logic circuit and netlists for specifying at least part of its structure is comprised of counting clock pulses applied to the logic circuit and resetting the logic circuit at a clock count higher than a highest number of clock pulses required by the logic circuit for carrying out a simulated logical function.

In accordance with another embodiment, a design protection circuit for a logic circuit is comprised of a counter for receiving clock pulses with the logic circuit and apparatus for resetting the logic circuit upon the counter counting a predetermined number of clock pulses, the predetermined number being higher than a highest number of clock pulses required by the logic circuit for carrying out a simulated logical function.

In accordance with another embodiment, a method of protecting the design of a logic circuit is comprised of operating the logic circuit and then disrupting operation of the logic circuit in the event the logic circuit is operated in excess of a normal time interval for a particular logical function.

In accordance with another embodiment, a method of protecting the design of a logic circuit is comprised of operating the logic circuit, detecting unusual operation of the logic circuit, and then disrupting operation of the logic circuit in the event the unusual operation of the logic circuit is detected.

BRIEF INTRODUCTION TO THE DRAWINGS

A better understanding of the invention will be obtained by reading the description of the invention below, with reference to the following drawings, in which:

FIG. 1 is a block diagram of an embodiment of the invention,

FIGS. 2A and 2B, attached together as shown in FIG. 2, form a schematic diagram of a preferred form of the counter, and FIG. 3 is a schematic diagram of a representative counter illustrated in FIG. 2B.

DETAILED DESCRIPTION OF THE INVENTION

Figure 1:
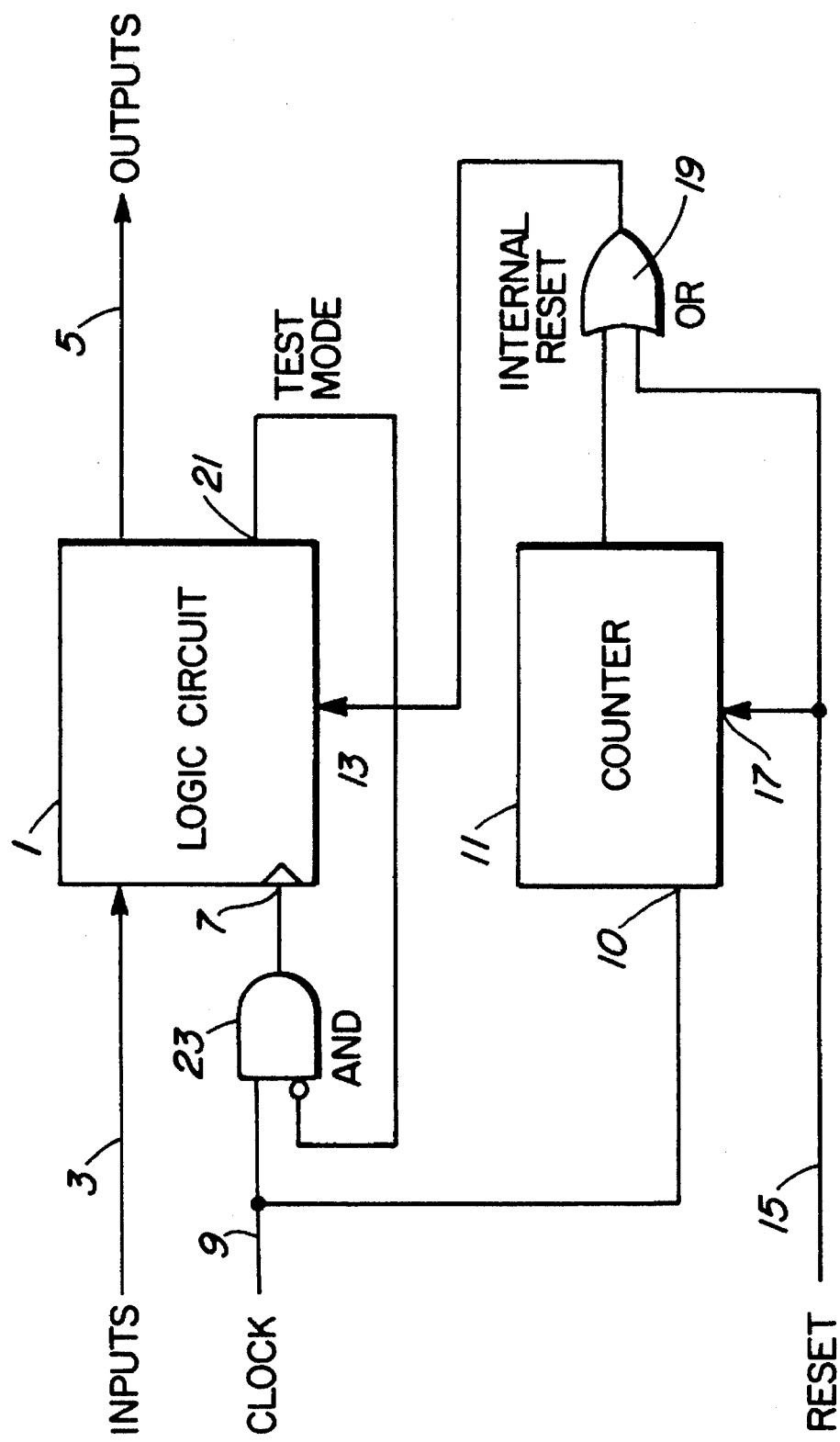

Turning to FIG. 1, a block diagram of an embodiment of the invention is shown. A logic circuit 1, which may be implemented as a ASIC, receives input signals on INPUTS bus 3 and provides output signals on an OUTPUT bus 5. The logic circuit includes a clock input 7 for receiving clock signals from a CLOCK line 9.

In accordance with a preferred embodiment of the present invention, the clock signal from the CLOCK line 9 is applied to a clock input of 10 counter 11. The output of the counter is an internal reset signal which is applied to a reset node or input 13 of the logic circuit.

The counter 11 is designed to provide an output logic signal when the count has reached a predetermined number which is higher than a highest number of clock pulses required by the logic circuit for carrying out a normal logical function, and therefore would never be reached during normal operation thereof, e.g. in a normal software simulation.

For example, the counter 11 can be a 32 bit counter which requires over 2 billion clock pulses to generate the internal reset signal. If the netlist of the ASIC is copied and then be used as part of another ASIC device, the counter portion would also be copied. The internal reset signal is generated in less than an hour, using the 32 bit counter and a 2 MHz clock. While the logic carried out by the logic circuit created using the ASIC will carry out its logic function in far less than this time, it will be reset by the counter after this time, totally disrupting normal operation of the ASIC device and rendering it useless.

In this manner the counter protects the design from copying or modification by unauthorized persons, since devices generated by the unauthorized persons are rendered useless.

Typically the logic circuit is initialized by the application of a reset signal to its reset input 13. In the present embodiment, the reset signal, appearing on RESET line 15, is also applied to the counter at its reset input 17 to reset its count. In this manner the counter counts the number of clock pulses applied to the logic circuit 1, from the time the clock is used by circuit 1 to carry out its logic function.

The internal reset signal is applied to one input of an OR gate 19, and the external reset signal on the reset line 15 is applied to the other input of OR gate 19. Thus either the internal reset signal or the external reset signal is applied to the reset input 13 of logic circuit 1, thereby resetting it, the internal reset signal disrupting the operation of the logic circuit.

To protect the supplier from accidentally using one of the protected netlists, one of the internal test modes of the logic circuit has an output 21. A test output signal on this output is inverted and logically ANDed with the clock signal in AND gate 23. When production test vectors are simulated and are compared with the design vectors, compare failures provide warning of the accidental use of the wrong netlist for device fabrication purposes. Since the supplier can keep the design vectors secret, it is not reasonably possible for the customer to be able to detect and avoid the protection circuit during normal operation of the circuit, nor to avoid it if the circuit is copied using the netlists provided with the ASIC.

It should be noted that the embodiment described herein constitutes one way of disrupting operation of the logic circuit if it is copied and used in an unauthorized manner. However in general concept the above described embodiment is a means and method for detecting improper operation of the logic circuit and for disrupting operation of it if improperly operated. The improper operation in this case is use of a design protected logic circuit as part of or in a circuit such as may be embodied in an ASIC which uses many more clock cycles than the protected logic circuit. However other improper use of the logic circuit may be detected, for example forms of signals output therefrom, and as a result operation of the logic circuit disrupted. While disruption of operation of the logic circuit is described as being effected by resetting it, other means of disruption could be used, such as by switching a lead to ground or to a disrupting logic level.

Figure 2A:
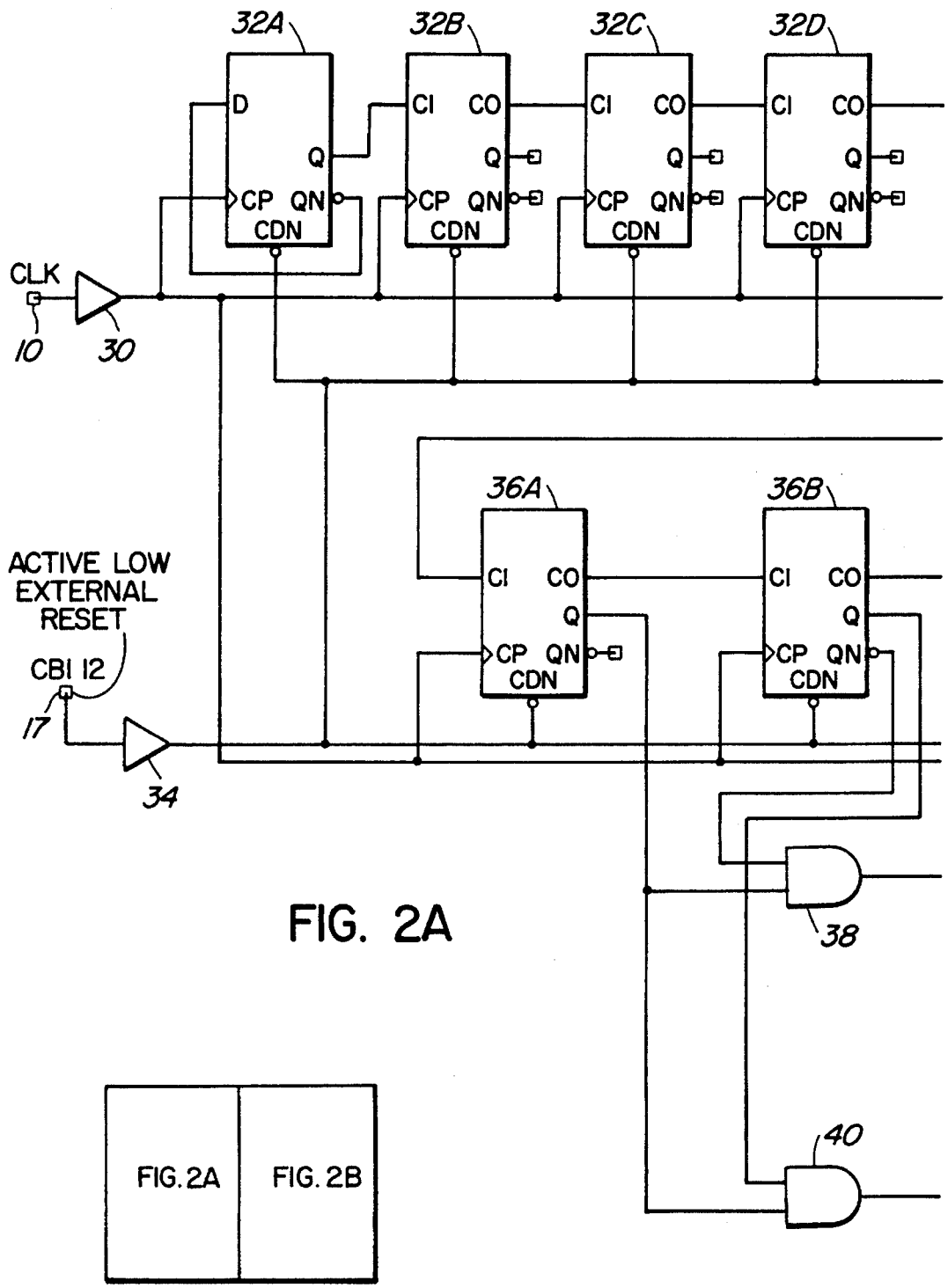
Figure 2:
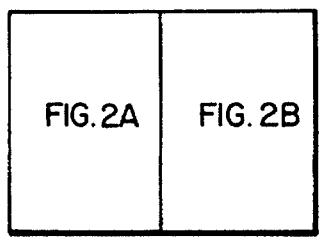
Figure 2B:
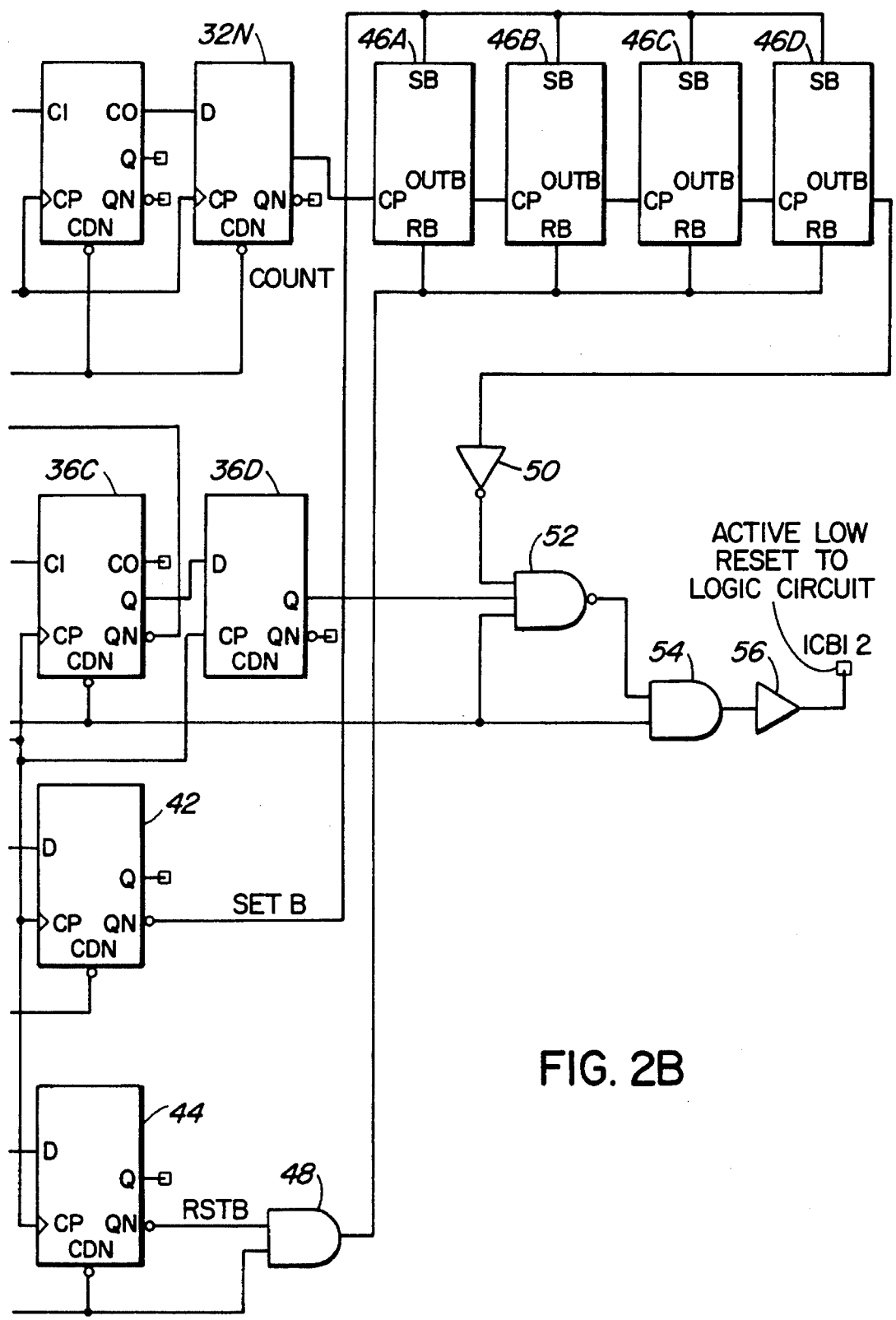

FIGS. 2A and 2B, attached together as shown in FIG. 2, form a more detailed schematic diagram of a preferred form of the counter 11. The clock signal CLK is received at input 10 and after passing through buffer amplifier 30, is applied to a pulse count PC input of each of counters 32A, 32B . . . 32N. The Q output of counter 32A is connected to the count in input CI of counter 32B, the count CO output of counter 32B is connected to the CI input of counter 32C, the CI input of counter 32C is connected to the CI input of counter 32D, etc., to counter 32N. The QN (/Q) output of counter 32A is connected to the D input of counter 32A. Counters 32A and 32N are one bit counters, e.g. flip flops.

A reset signal input CBI signal from reset input 17 is applied to the CDN inputs of counters 32A–32N after passing through buffer amplifier 34. Thus it may be seen that after receiving a reset signal, counters 32A–32N count clock pulses, each counter receiving the output logic signal of the preceding counter once it has counted to its maximum capacity, in a well known manner.

Another sequence of counters 36A, 36B, 36C and 36D are interconnected to count clock pulses. The clock signal CLK is applied to the CP input of counters 36A, 36B, 36C and 36D. The count out CO output of counter 36A is connected to the count in CI input of counter B, the CO output of counter 36B is connected to the CI input of counter 36C, and the Q output of counter 36C is connected to the D input of counter 36D. The QN output of counter 36C is connected to the CI input of counter 36A. The CDN (reset) inputs of counters 36A–36D are connected to the reset input 17.

The Q and QN outputs of counter 36B are connected to respective inputs of AND gates 38 and 40. The other inputs to gates 38 and 40 are connected together and to the Q output of counter 36A. The outputs of AND gates 38 and 40 are connected to respective D inputs of one bit counters 42 and 44, preferably flip flops. The QN output of flip flop 42 is connected to the SB (set) inputs of each of counters 46A, 46B, 46C and 46D. The QN output of counter 44 is connected to one input of AND gate 48, the output of which is connected to the RB (reset) inputs of counters 46A–46D. The second input of AND gate 48 is connected to the reset signal input 17, with the CDN inputs of counters 42 and 44.

While the sequence of counters 32A–32N and 46A–42D could provide the reset output described above, in a second embodiment the circuitry involving counters 36A–36D, and 42 and 44 with gates 38 and 40 are used to provide a safeguard that the counter is not discovered. A technique for checking the ASIC is to drive its inputs and to receive a report of whether any of its elements are nonfunctional. Thus if this were done during a time interval which involves a relatively small number of clock cycles, the higher order counters would not count, and a "not toggled" report would result for those counters.

In this embodiment, the higher order counters 46A–46D are set and then reset (cleared) by the signals applied to their SB and RB inputs, which signals are derived from the counters 42 and 44. The counters 36A–36C cyclically drive each other in sequence from clock pulses after being reset by the buffered reset signal. A logic input signal is applied alternatingly to the respective AND gates 38 and 40 from the Q and QN outputs of counter 36B, and a signal enabling the AND gates is applied from the Q output of counter 36A. As a result, a logic signal is output from AND gates 38 and 40 following the each time counter 36A counts up, which occurs each time counter 36C counts, which is occurs at the logical multiplication value of the count values of all three counters 36A–36C. The high order counters 46A–46D are thus set and reset as the logical true outputs of AND gates 38 and 40 appear. Counters 36A–36C and AND gates 38 and 40 form a state machine, which specifies when high order counters 46A–46D are set and reset.

The output of counter 46d is connected through inverter 50 to an input of NAND gate 52. The Q output of counter 36D is also connected to an input of NAND gate 52. The buffered reset signal is connected to a third input of NAND gate 52, as well as to an input of AND gate 54. The output of NAND gate 52 is connected to another input of AND gate 54, and the output of AND gate 54 is connected to the input of buffer 56.

The logic function performed by gates 52 and 54 is to generate an active low reset on the ICBI[12] output pin when the external reset pin, CBI[12], is active low or when the setting/resetting operation of the higher order counters 46A–46D is complete and the counter 46D has reached the internal reset activation level.

Figure 3:
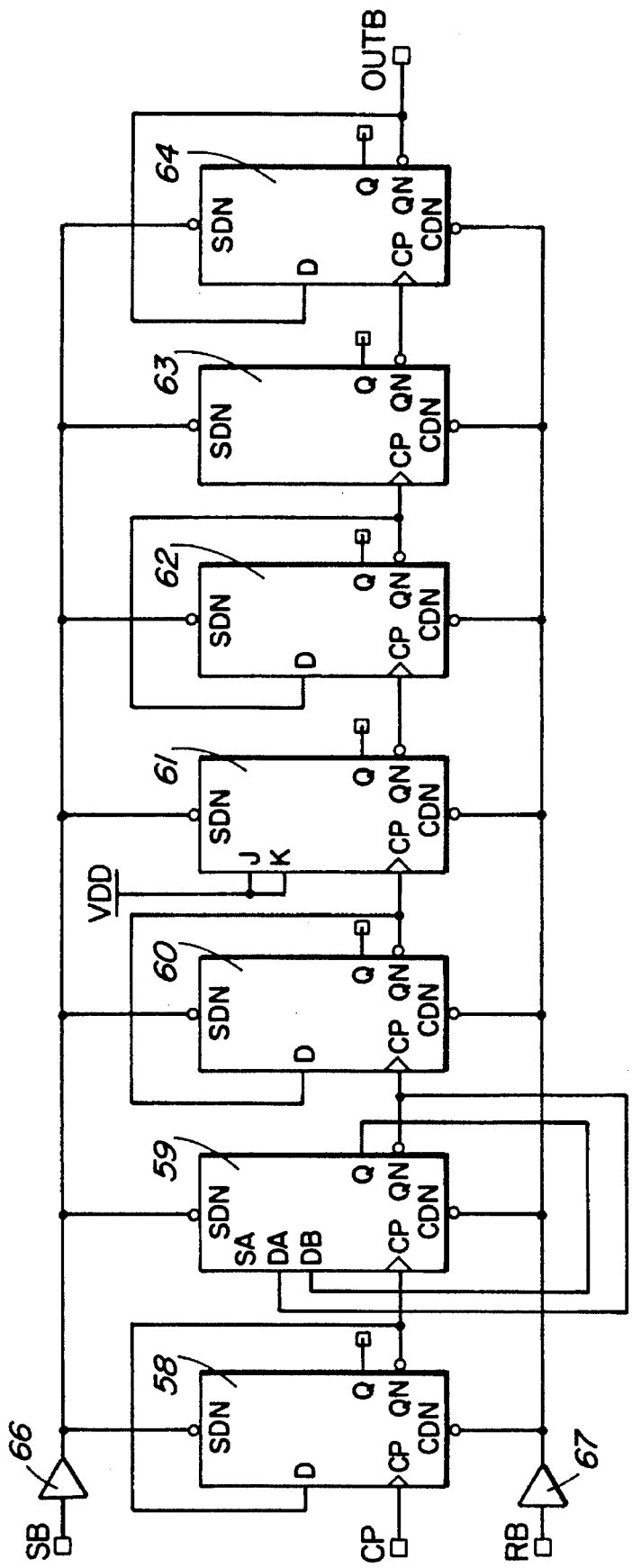

A representative one of each of the counters 46A–46D is shown in FIG. 3. It is comprised of 1 bit counters 58, 59, 60,

61, 62, 63 and 64, each of which may be a flip flop. The set input SB is connected through a buffer 66 to the SDN inputs of each of counters 58–64, and the reset input RB is connected through a buffer 67 to the CDN inputs of each of counters 58–64. The count output of counter 32N is connected through the CP input to the CP (clock pulse) input of counter 58, and the QN output of each buffer is connected to the CP input of the next successive buffer in series. The QN outputs of each of counters 58, 60, 62 and 64 are connected to their respective D inputs. The Q and QN outputs of counter 59 are connected to its DB and DA inputs respectively. The output signal is provided at the OUTB terminal which is connected to the QN output of counter 64.

In operation, a sequence of pulses at the CP input causes the counters to successively pass them along with receipt of each additional pulse, and finally when a pulse is passed out of counter 64 it appears on the OUTB terminal. This pulse is applied to the next counter in sequence of counters 46A–46D.

When a set logic signal appears at the SB terminal, it sets (inserts a logical 1 into) each of the counters 58–64, and when a reset logic signal appears at the RB terminal, it clears each of the counters 58–64. The connection of the QN outputs to the D inputs of counters 58, 60, 62 and 64 maintains a logic 0 store in each of the counters after reset.

A person understanding this invention may now conceive of alternative structures and embodiments or variations of the above. All of those which fall within the scope of the claims appended hereto are considered to be part of the present invention.

We claim:

1. A design protection circuit for a logic circuit comprising a counter for receiving clock pulses with said logic circuit and means for resetting the logic circuit said counter counting predetermined number of clock pulses, said predetermined number being higher than a highest number of clock pulses required by the logic circuit for carrying out a simulated logical function, external means for resetting the counter and the logic circuit at substantially the same time, the logic circuit being comprised of a reset node, and an OR gate having one input for receiving an internal reset signal from the counter and an external reset signal at another input, its output being connected to the reset node of the logic circuit, whereby the logic circuit may be reset by either the internal reset signal or the external reset signal.

2. A circuit as defined in claim 1 including means for setting and clearing higher order bits in the counter during testing of the logic circuit and prior to reaching a clock count to those higher order bite by the counter.

3. A circuit as defined in claim 1 in which the logic circuit is implemented in an ASIC.

4. A circuit as defined in claim 1 in which the counter is at least a 33 bit counter for counting in excess of 2 billion clock pulses before generating the internal reset signal.

5. A design protection circuit for a logic circuit comprising a counter for receiving clock pulses with said logic circuit and means for resetting the logic circuit upon said counter counting a predetermined number of clock pulses, said predetermined number being higher than a highest number of clock pulses required by the logic circuit for carrying out a simulated logical function, external means for resetting the counter and the logic circuit at substantially the same time, the logic circuit being comprised of a test mode output, means for inverting a test mode output signal and logically ANDing it with the clock pulses prior to application of the clock pulses to the logic circuit.

6. A circuit as defined in claim 5 including means for setting and clearing higher order bits in the counter during testing of the logic circuit and prior to reaching a clock count to those higher order bits by the counter.

* * * * *